Aug. 21, 1956 F. J. FEAGIN 2,760,068

OSCILLATORY NETWORKS

Filed April 28, 1951 2 Sheets-Sheet 1

INVENTOR.
Frank J. Feagin,
BY Dwight C. Otis
AGENT.

Aug. 21, 1956 F. J. FEAGIN 2,760,068

OSCILLATORY NETWORKS

Filed April 28, 1951 2 Sheets-Sheet 2

INVENTOR.
Frank J. Feagin,
BY Dwight C. Otis
AGENT.

United States Patent Office 2,760,068 Patented Aug. 21, 1956

2,760,068

OSCILLATORY NETWORKS

Frank J. Feagin, Houston, Tex., assignor, by mesne assignments, to Esso Research and Engineering Company, Elizabeth, N. J., a corporation of Delaware Application April 28, 1951, Serial No. 223,586

2 Claims. (Cl. 250—36)

This application relates to improvements in inductance-capacitance tuned tank circuits or networks suitable for use in tuned alternating current amplifiers or oscillators. More particularly the application relates to critical points for connecting a load circuit to a resonant tank network having two parallel branches, one of which branches is an inductive reactance and the other branch is a capacitance reactance.

Because of their ability to store alternating current energy and to supply this stored energy to other circuits connected thereto, certain combinations of inductors and capacitors are commonly referred to as "tank circuits" or "tank networks." Those tank circuits which include an inductor connected in series with a capacitor wherein the inductive reactance of the inductor is equal to the capacitive reactance of the capacitor at a selected operating frequency are commonly designated as "series resonant" tank circuits. Similarly, those tank circuits in which an inductor is connected in parallel, or shunt, with a capacitor and the inductive reactance is approximately equal to the capacitive reactance at the operating frequency are commonly called "parallel resonant" tank circuits.

A variety of self-excited electron discharge tube oscillator or signal generator circuits employing one or the other of the above-mentioned inductance-capacitance tuned tank networks have been devised by others and are well-know in the prior art. Specific mention may be made of the Colpitts, Hartley, Franklin and ultraaudion oscillators as being typical of these circuits. Basically each of these oscillator circuits comprises an electron discharge tube amplifier of one form or another, an inductance-capacitance tuned tank network, and means connecting the tank network to the amplifier in a manner such that a small portion of the amplifier output energy is fed back, through a path which includes at least a part of the tank network, into the input of the amplifier in proper phase and sufficient amount to sustain continuous generation of oscillations.

The resonant operating frequency of these oscillation generators is governed primarily by the values of inductive reactance and capacitive reactance in the tank network but is also affected by impedances reflected into the tank network from the amplifier and from the load. Accordingly changes in the reflected impedances, such as may be caused by changes in the operating voltages applied to the amplifier or by changes in the output load connected to the tank network, will cause a shift in the operating frequency.

In a paper published in "Proceedings of the Institute of Radio Engineers," March 1948, pages 356–358, J. K. Clapp has disclosed a modification of the Colpitts oscillator circuit which minimizes, in a large degree, adverse effects upon frequency stability produced by changes in potentials applied to the electron discharge tube employed therewith. The above-named author does not disclose, however, any way in which an output load may be connected onto the frequency-controlling tank network without producing adverse variations in operating frequency as a result of variations in impedance of the load.

The present improvement in tank networks is based upon the discovery of critical points on a tank network, similar to the frequency-controlling tank network in the Clapp modified oscillator, whereat either a reactive or a resistive output load may be connected without producing a substantial shift in the operating frequency thereof. When employing the improved tank circuit and load connections disclosed herein, the impedance of an output load connected thereto may be varied over a very wide range without causing an appreciable shift in the operating frequency thereof. While the improved tank network to be described below is particularly useful in self-excited, inductance-capacity tuned oscillators where a high degree of frequency stability is desired, it also has utility in tuned power amplifiers and the like.

My improvement may best be understood by reference to the accompanying drawing in which Figure 1 is a schematic circuit diagram (employing conventional symbols) showing one embodiment of the improved tank circuit and load connections thereto;

Figure 2:
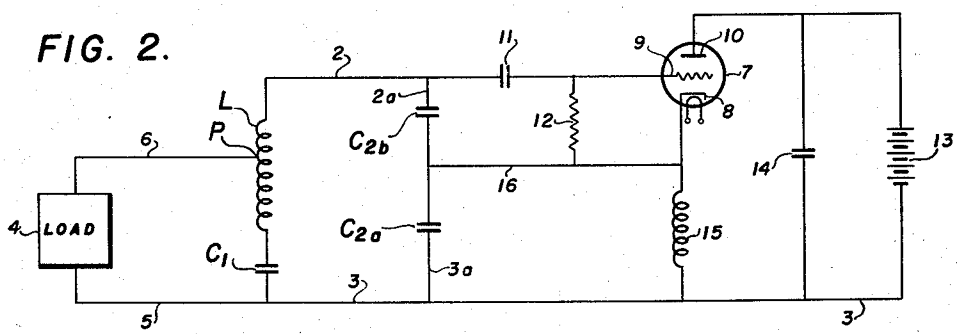
Figure 2 is a schematic circuit diagram of a self-excited oscillator employing the improved tank network and load connections.
Figure 3:
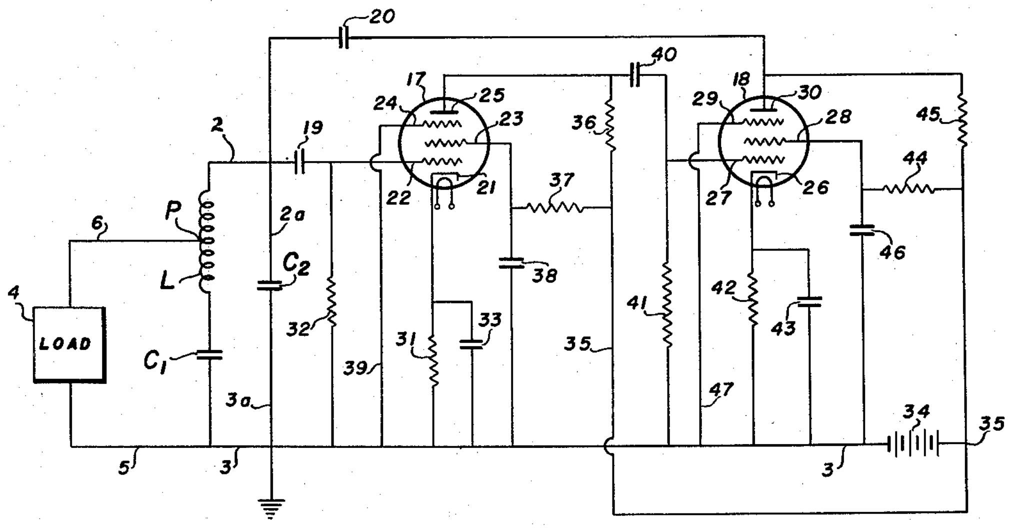
Figure 3 is a schematic circuit diagram of a second form of self-excited oscillator employing the improved tank network and load connections.
Figure 5:
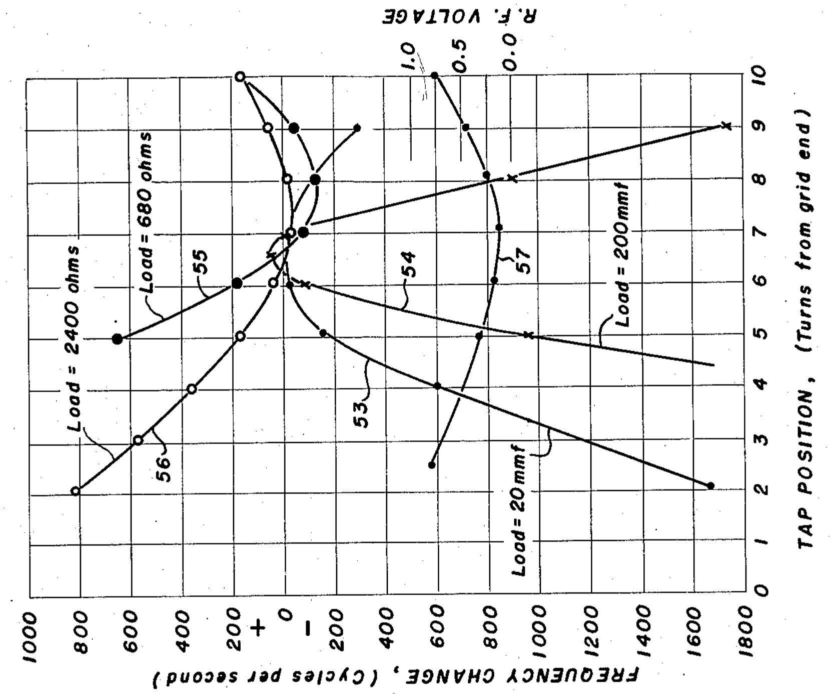
Figure 4:
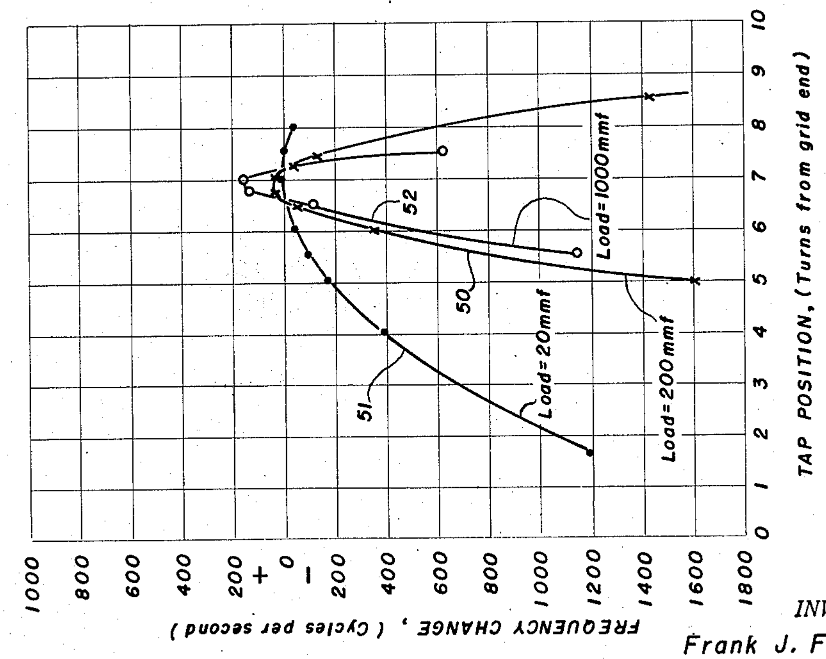

Figure 4 is a graph illustrating the change in operating frequency which occurs when different capacitive reactances are applied at different points on the frequency-controlling tank circuit of an oscillator constructed in accordance with Figure 2; and Figure 5 is a graph showing changes which have been measured when different types of loads were connected at different points on the tank network of an oscillator constructed in accordance with the diagram of Figure 3.

In the several figures of the drawing, identical characters, when used, refer to identical elements.

Figure 1:
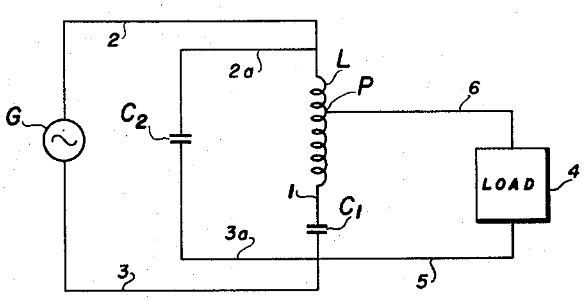

Referring first to Figure 1, the letter L designates an inductor which may consist of a suitable number of turns of wire or other metallic conductor arranged in the form of a solenoid. A conductor 1 connects one end of inductor L to one terminal of a first capacitor $C_1$. A second conductor 2, having a branch 2*a*, connects the other end of inductor L to one terminal of an alternating current generator means G while the branch 2*a* connects said end to one terminal of a second capacitor $C_2$. A third conductor 3, having a branch 3*a*, connects a second terminal of the first capacitor $C_1$ to a second terminal of generator means G while the branch 3*a* connects said capacitor $C_1$ to a second terminal of capacitor $C_2$.

When viewed from the two terminals of inductor L, it will be seen that capacitors $C_1$ and $C_2$ are connected in series therewith. However, when viewed from the terminals of generator means G, inductor L and capacitor $C_1$ are connected in series and form one branch of a parallel network having capacitor $C_2$ in the second branch and connected in parallel therewith. In subsequent discussion the network containing inductor L and capacitors $C_1$ and $C_2$ will be referred to as a network having two parallel branches, a first of said branches containing inductor L and capacitor connected in series, and the second of said branches containing capacitor $C_2$ connected in parallel or shunt with the first branch.

In the construction of a tank network in accordance with Figure 1, the inductance of inductor L and the capacitance of capacitor $C_1$ are so chosen with respect to the desired operating frequency that L and $C_1$ are not series resonant but appear as a net inductive reactance at said frequency. Capacitor $C_2$, on the other hand, is chosen so as to be a capacitive reactance approximately equal to the net inductive reactance of inductor L and capacitor $C_1$, thereby providing a parallel resonant network at the operating frequency of generator means G.

I have observed that, if a reactive or a resistive load be connected across the tank network containing L, $C_1$ and $C_2$ at points substantially other than certain critical points to be identified hereinbelow, the resonant frequency of the network will be shifted from its normal operating value. I have discovered, however, that, if one terminal of a reactive, or a resistive load, such as is represented by the element 4 in Figure 1, be connected by a conductor 5 to the above-described network at a junction between capacitors $C_1$ and $C_2$ (as, for example, a point on conductor 3 or 3*a*), the other terminal of the load may be connected, as by a conductor 6, at a critical point P on inductor L without altering the resonant frequency of the tank network.

The location of critical point P on inductor L depends upon the structural configuration and particular effective values of capacitance and inductance employed in the tank network, but its location may be readily found in any one of several ways.

Thus, the location of point P is approximately defined by the equation $$t=T\left(1-\frac{C_1}{C_2}\right)$$

where $t$ is the number of turns on inductor L measured between point P and the common junction of L and $C_1$, T is the total number of turns on inductor L, $C_1$ is the capacitance of capacitor $C_1$, and $C_2$ is the capacitance of capacitor $C_2$.

The position of critical point P may also be defined as a point of minimum alternating current potential which may be measured from the junction of capacitors $C_1$ and $C_2$ to successive points along inductor L.

When the tank network of Figure 1 is the frequency-controlling network of a self-sustaining oscillator (hereinafter to be referred to as a test oscillator), the precise position of critical point P may be found experimentally in the following manner:

The original operating frequency of the signal generated by the test oscillator is carefully measured with the aid of a suitable frequency meter. Thereafter, a suitable load, such as a low value of capacitance, is arranged with one terminal thereof effectively connected to the junction of capacitors $C_1$ and $C_2$. The other terminal of the load is then connected to successive points along inductor L and successive measurements of the operating frequency of the test oscillator are made with suitable notice being taken of the direction in which the frequency is shifted with respect to the original operating frequency. When the critical point P is reached, connection and disconnection of the load will not produce any change from the original frequency, provided that precautions are taken to avoid simultaneous introduction of "body capacity," or other stray capacitance effects, into the electrostatic field of the tank network or other critical parts of the test oscillator circuit.

Referring now to Figure 2 it may be seen that a schematic diagram of a Colpitts type of oscillator employing the improved tank network and load connections of Figure 1 is shown. Figure 2 differs from Figure 1 in that capacitor $C_2$ of the latter has been replaced by two series-connected capacitors $C_{2a}$ and $C_{2b}$, and generator G has been replaced by an amplifier network containing a high vacuum electron discharge tube 7 having an electron emissive cathode 8, a control grid 9, and an anode 10.

A blocking capacitor 11 is inserted in conductor 2 between one end of inductor L and control grid 9, and a bias resistor element 12 is connected between control grid 9 and cathode 8. The anode 10 is connected in conventional manner to the positive terminal of a source of direct current power 13. The negative terminal of source 13 is connected through conductor 3 to the junction of capacitors $C_1$ and $C_{2a}$. So that alternating current power developed in the anode circuit of tube 7 may by-pass direct current power source 13, a capacitor 14 having low reactance at the operating frequency is connected between anode 10 and conductor 3. Also to complete the direct current path from anode 10 through power source 13 to cathode 8, a suitable inductor 15, having high reactance at the operating frequency, is connected between cathode 8 and conductor 3. Cathode 8 is also connected by a conductor 16 to a junction between capacitor $C_{2a}$ and $C_{2b}$. As will be apparent to workers in the art, capacitors $C_{2a}$ and $C_{2b}$ form an alternating current voltage divider whereby a suitable portion of the alternating current energy generated in the anode circuit of tube 7 is fed back to the control grid in proper phase and amount sufficient to sustain continuous oscillation at a frequency determined primarily by the reactances of L, $C_1$, $C_{2a}$ and $C_{2b}$.

Turning now to Figure 3 there is shown a schematic diagram of an oscillator similar to the so-called Franklin oscillator of the prior art but employing the improved tank network and load connections described with respect to Figure 1. The circuit of Figure 3 differs from that of Figure 1 in the respect that an amplifier, containing two resistance-capacitance coupled electron discharge tubes 17 and 18, has been substituted for generator G and means, including capacitors 19 and 20, have been provided to feed a portion of the output energy from the amplifier into the frequency-controlling tank network and thence into the amplifier input in proper phase and amount sufficient to sustain continuous oscillation therein.

In the diagram of Figure 3 electron discharge tube 17 has been shown as a conventional pentode having an electron emissive cathode 21, a control grid 22, a screen grid 23, a suppressor grid 24, and an anode 25. Similarly tube 18 has been shown as a pentode having a cathode 26, a control grid 27, a screen grid 28, a suppressor grid 29, and an anode 30. It will be evident to workers in the art, however, that conventional triodes or conventional tetrodes may be substituted for pentodes 17 and 18 with consequent simplification of the oscillator circuit.

The control element 22 of tube 17 is connected through capacitor 19 and conductors 2 and 2*a* to one terminal of inductor L and an adjacent terminal of capacitor $C_2$. The cathode 21 is connected through a cathode bias resistor element 31 to conductor 3, which may be a common ground point for the oscillator circuit, and thence to a junction of capacitors $C_1$ and $C_2$. The frequency controlling tank network comprising inductor L, capacitor $C_1$, and capacitor $C_2$ is thus connected across the input of tube 17. So that electrons which collect upon grid 22 may return to cathode 21 through an external path, a resistor 32 is connected between said grid and the common ground point provided by conductor 3. A capacitor 33 is connected in parallel with cathode resistor 31 to provide a low impedance path for alternating current flowing in the cathode circuit.

Operating potentials are applied to the anode 25 and screen grid 23 of tube 17 from a source of direct current power 34 having its negative terminal connected to the common ground point provided by conductor 3, and its positive terminal connected to a conductor 35. A plate or anode load resistor 36 is connected between anode 25 and conductor 35, and a screen voltage dropping resistor 37 is connected between screen grid 23 and conductor 35. A by-pass capacitor 38 connected between screen grid 23 and conductor 3 provides a low impedance path from said grid to the common ground point. The suppressor grid 24 is connected to the common ground point in conventional manner through a conductor 39.

The alternating current energy developed in the anode circuit of tube 17 is applied to the control grid 27 of tube 18 through a blocking capacitor 40. A resistor 41 connected at one end to grid 27, and at the other to the common ground point provided by conductor 3, permits electrons accumulating on grid 27 to leak off to ground. A bias resistor 42, by-passed by a suitable capacitor 43, is connected from cathode 26 to conductor 3. Operating potentials are applied to screen grid 28 and anode 30 from the positive terminal of source 34 through resistors 44 and 45, respectively. Screen grid 28 is by-passed to the common ground point through a capacitor 46 and the suppressor grid 29 is grounded through a conductor 47.

A suitable portion of the alternating current energy developed in the anode circuit of tube 18 is introduced into the frequency-controlling tank network, comprising inductor L and capacitors $C_1$ and $C_2$, through a relatively small capacitance provided by capacitor 20 which is connected between anode 30 and the common junction between inductor L, capacitor $C_2$ and the capacitor 19 leading to grid 22 of tube 17.

In each of the oscillator circuits shown in Figures 2 and 3 the useful output load is connected to the frequency-controlling tank network between critical point P on inductor L and a common junction between capacitors $C_1$ and $C_2$ (or $C_{2a}$). Critical point P may be determined in either case by one or more of the methods described with respect to Figure 1. In practical operations, load 4 will generally be the input circuit of a succeeding buffer or power amplifier stage and will therefore appear as a capacitive reactance, or, in some instances, a resistive load, across a portion of inductor L and capacitor $C_1$. If for any reason it is desired to arrange the tank network in a manner inverted from that shown in the drawing, i. e. in a manner such that the common junction of capacitors $C_1$ and $C_2$ is connected to the control grid of the electron discharge tube, then the connections to the output load must also be inverted so that one terminal thereof remains at the common junction of capacitors $C_1$ and $C_2$ and the other terminal is connected to critical point P on inductor L. It will be apparent that other modifications may be made, such as the manner of applying operating potentials to the electron discharge amplifier, with consequent rearrangement of suitable means for by-passing alternating currents from certain electrodes thereof. The improved tank circuit may also be readily applied to other oscillator circuits (not shown), such as the well known Hartley oscillator, in a manner which will become apparent to workers skilled in the art.

The position of critical point P on inductor L is a function of the ratio of the capacitances of capacitors $C_1$ and $C_2$. Accordingly, it is desirable to make both the capacitance of $C_1$ and the capacitance of $C_2$ variable and to gang these capacitors in a manner such as to keep the capacitance ratio substantially constant if it is desired to make the output frequency adjustable over a suitable range and yet retain all of the advantages of my improved network. Alternatively, however, the position at which conductor 6 is tapped onto inductor L may be adjusted as the ratio of capacitances of capacitor $C_1$ to capacitor $C_2$ is changed due to intentional variation of one or the other of these capacitances.

Turning now to Figure 4 there is shown a graph representing data obtained upon an oscillator constructed in accordance with the diagram of Figure 2. The particular oscillator employed while obtaining the data shown in Figure 4 had an inductor L consisting of 60 turns of bare wire uniformly space-wound upon a grooved coil form 1.75 inches in diameter to form a single layer solenoid 3 inches long. Capacitor $C_1$ was a commercially available silvered mica capacitor having a capacitance of 100 micro-microfarads. Capacitors $C_{2a}$ and $C_{2b}$ were also silvered mica capacitors each having a capacitance of 2000 micro-microfarads. Thus, the ratio of capacitance of $C_1$ to the effective capacitance of $C_{2a}$ and $C_{2b}$ in series was substantially 1:10. The normal operating frequency of the oscillator was approximately 1900 kilocycles.

The radiated output of the above-described test oscillator was heterodyned against a signal generated by a Class C–121–HLD Primary Frequency Standard manufactured by General Radio Co. of Cambridge, Mass. This frequency standard includes auxiliary interpolating and measuring equipment capable of detecting a frequency change of one part in ten million. It was observed that the direct current potential applied to the anode of a conventional type 6J5 triode employed in the test oscillator could be varied from approximately 150 to 400 volts without producing an appreciable change in the beat note produced by heterodyning the test oscillator signal against a signal generated by the frequency standard.

Thereafter, one terminal of a 200 micro-microfarad silvered mica capacitor was secured to the junction between capacitors $C_1$ and $C_{2a}$, and the other terminal was touched at selected points along the bare wire forming inductor L, precautions being taken to avoid "body capacity" effects in the electrostatic field of the test oscillator. By means of a frequency meter forming a part of the frequency standard, the changes in frequency produced in the test oscillator by tapping the capacitive load onto inductor L were measured and the resulting changes in frequency were plotted as ordinates upon a graph, similar to Figure 4, wherein the number of turns, measured from the grid end of inductor L, were plotted as abscissas. Upon drawing a smooth curve through the plotted points, the curve designated by the numeral 50 in Figure 4 was obtained.

From an examination of curve 50 it may be seen that, when the capacitive load was connected to inductor L at 6.5 turns and again at 7.5 turns from the grid end thereof, the frequency of the test oscillator was shifted downward. On the other hand, when the load was connected at 6.75 or at 7.0 turns from the grid end, the frequency was shifted slightly upward from its normal operating point.

The above-described measurements were repeated employing in place of the 200 micro-microfarad load, capacitors having capacitances of 20 micro-microfarads and 1000 micro-microfarads. The data obtained in these tests are represented by the curves 51 and 52, respectively, in Figure 4. It will be apparent from the curves in Figure 4 that the critical point P on inductor L for this particular oscillator is substantially at the 7th turn from the grid end of the inductor as indicated by the points of maximum inflection of curves 51, 52, and 53. It will also be apparent that loads having impedances numerically larger than the impedance of capacitor $C_1$ at the operating freqency produce a relatively broad critical region, whereas loads having impedances numerically smaller than that of $C_1$ produce a relatively sharp critical region requiring careful selection of the point of attachment of the load. Accordingly, when the impedance of the load is substantially smaller than the impedance of series capacitor $C_1$, the exact point of attachment of the load onto inductor L is best determined by brief tests analogous to those described above. As will be evident from Figure 4, however, the point of attachment will be within a few per cent of the critical point P irrespective of the impedance of the load.

In subsequent tests, the above-described capacitive loads were replaced by an inductor having an impedance magnitude approximately equivalent to one of the capacitive loads at the operating frequency. It was found that the critical point P was substantially unchanged and the inductive load could be applied or removed at the critical point without shifting the operating frequency.

An oscillator was then constructed in accordance with the diagram of Figure 3 employing an inductor L having substantially the same dimensions as described with respect to Figure 4. Capacitor $C_1$ was again a 100 micro-microfarad silvered mica capacitor and $C_2$ was a 1000 micro-microfarad silvered mica capacitor. When silvered mica capacitors having capacitances of 20 micro-microfarads and 200 micro-microfarads were individually utilized as the output load 4, and the conductor 6, as shown in Figure 3, was tapped at successive different points along inductor L, the data represented in Figure 5 by the curves 53 and 54, respectively, were obtained.

Measurements were then made upon the same oscillator when employing 680 ohm and 2400 ohm substantially non-inductive carbon resistors as load 4. As the point of connection of conductor 6 was moved along inductor L, the data graphically represented by curves 55 and 56, respectively, were obtained.

Subsequently measurements of the radio frequency voltage measurable between a terminal formed by the junction of capacitors $C_1$ and $C_2$, and terminals represented by successive points along inductor L were obtained with a vacuum tube voltmeter having a low capacity input. The voltage was at a maximum when measured directly across capacitor $C_1$ and decreased to a minimum substantially at the critical point P (seventh turn from the grid end of the coil) as determined by measurements of the effects of different loads upon the operating frequency. As the critical point on inductor L was passed, the voltage gradually rose again. The measured voltage plotted against the tap point position on inductor L is represented by the curve 57 in Figure 5.

Capacitors $C_1$ and $C_2$ in the above described oscillator were then replaced by two other silvered mica capacitors each having a capacitance of 1000 micro-microfarads. As a result, the normal operating frequency of the oscillator was changed. Upon repetition of measurements similar to those described above, it was found that the critical point P on inductor L had shifted to approximately the mid-point on the inductor.

From the foregoing exemplary description, it will be apparent that the critical point P may be determined approximately from a knowledge of the ratio of the effective capacitances of capacitors $C_1$ and $C_2$ and the number of turns on inductor L. However, the precise position of point P is best determined by measurements analogous to those described above. In any event, however, critical point P will be found substantially at (i. e. with a few per cent of) a point of minimum alternating potential on inductor L.

Having fully described the nature of my improvement and the manner in which it may be practiced, what I claim as new and useful and desire to secure by Letters Patent is:

1. In a self-sustaining oscillator system comprising an electron discharge amplifier having means for applying operating potentials thereto and means for coupling a portion of the output energy from said amplifier into the input thereof sufficient to sustain oscillation in said system, said coupling means including a resonant, frequency-controlling network having two parallel branches, one of said branches being a net inductive reactance formed by a first capacitor connected in series with an inductor and the other of said branches being a capacitive reactance comprising at least a second capacitor, the improvement comprising means for connecting an output load between two spaced points along said inductive reactance branch, a first of said points being defined by the junction between said first and second capacitors and the second of said points being on said inductor substantially at a critical point defined approximately by the expression $$t=T\left(1-\frac{C_1}{C_2}\right)$$

wherein $t$ is the number of inductor turns between said critical point and a junction between said inductor and said first capacitor, T is the total number of turns on said inductor, $C_1$ is the effective capacitance of said first capacitor, and $C_2$ is the effective capacitance of said capacitive reactance branch.

2. An improved alternating current circuit comprising a resonant oscillatory network having a first branch consisting of an inductor connected in series with a first capacitor and having a net inductive reactance at an operating frequency, with one end of said inductor being connected to one plate of said first capacitor and each point on said inductor having an alternating current potential other than zero, a second branch having a capacitive reactance approximately equal to said net inductive reactance at said operating frequency and comprising at least a second capacitor, said second branch being connected to said first branch at two junctions, the first junction being spaced from the other end of said inductor and the second junction being spaced from the other plate of said first capacitor, means for applying an alternating potential having said operating frequency simultaneously across said two branches, and means connecting an output load to said network at two spaced points along said first branch, one of said points being at said second junction, and the other of said points being substantially at a critical point on said inductor at which a minimum alternating current potential occurs at said operating frequency whereby the resonant frequency of said network is not substantially altered by application of said load.

References Cited in the file of this patent

UNITED STATES PATENTS

| | | |
|---|---|---|
| 1,624,537 | Colpitts | Apr. 12, 1927 |
| 2,018,370 | Lunnon | Oct. 22, 1935 |
| 2,416,172 | Gregory | Feb. 18, 1947 |
| 2,447,616 | Lappin et al. | Aug. 24, 1948 |
| 2,540,613 | Foley et al. | Feb. 6, 1951 |
| 2,623,176 | Witsenberg et al. | Dec. 23, 1952 |
| 2,626,354 | Cheek | Jan. 20, 1953 |

OTHER REFERENCES

Publication: "An Inductance-Capacitance Oscillator of Unusual Frequency Stability," Proc. I. R. E., October 1948, pages 1261 to 1262.